(12) United States Patent
Ivkovich, Jr. et al.

(10) Patent No.: US 7,754,043 B2
(45) Date of Patent: Jul. 13, 2010

(54) METHOD FOR APPLYING AN OPTICAL COATING TO A SURFACE OF AN ARTICLE

(75) Inventors: Daniel Peter Ivkovich, Jr., Fairfield, OH (US); Andrew Jay Skoog, West Chester, OH (US); Jane Ann Murphy, Franklin, OH (US); Thomas Walter Rentz, Cincinnati, OH (US); William Randolph Stowell, Rising Sun, IN (US); Bryan Thomas Bojanowski, Cincinnati, OH (US)

(73) Assignee: General Electric Company, Schenectady, NY (US)

( * ) Notice: Subject to any disclaimer, the term of this patent is extended or adjusted under 35 U.S.C. 154(b) by 584 days.

(21) Appl. No.: 11/623,547

(22) Filed: Jan. 16, 2007

(65) Prior Publication Data

US 2007/0172585 A1    Jul. 26, 2007

Related U.S. Application Data

(63) Continuation of application No. 10/702,801, filed on Nov. 6, 2003, now abandoned.

(51) Int. Cl.
| | |
|---|---|
| B44C 1/175 | (2006.01) |
| B29C 65/02 | (2006.01) |
| B29C 65/56 | (2006.01) |
| B29C 33/58 | (2006.01) |
| B32B 37/06 | (2006.01) |
| B32B 37/10 | (2006.01) |

(52) U.S. Cl. .................... 156/236; 156/230; 156/235; 156/289; 156/344; 427/146; 427/148; 427/167; 427/152

(58) Field of Classification Search ................. 156/230, 156/232, 235, 247, 344; 427/146, 148, 162, 427/164, 166–169, 152, 154, 161
See application file for complete search history.

(56) References Cited

U.S. PATENT DOCUMENTS

| | | | | |
|---|---|---|---|---|
| 3,654,016 | A * | 4/1972 | Alexander | 156/247 |
| 4,153,494 | A * | 5/1979 | Vilaprinyo Oliva | 156/230 |
| 4,381,716 | A * | 5/1983 | Hastings et al. | 109/2 |
| 4,407,685 | A * | 10/1983 | Hankland | 156/212 |
| 4,481,999 | A * | 11/1984 | Duchane et al. | 164/6 |
| 4,623,087 | A * | 11/1986 | Conolly | 228/176 |
| 5,830,529 | A * | 11/1998 | Ross | 427/152 |
| 6,049,419 | A | 4/2000 | Wheatley et al. | |
| 6,090,248 | A * | 7/2000 | White et al. | 204/298.26 |
| 6,165,600 | A | 12/2000 | Ivkovich, Jr. et al. | |
| 7,473,331 | B2 * | 1/2009 | Ivkovich et al. | 156/236 |

* cited by examiner

Primary Examiner—Philip C Tucker
Assistant Examiner—Sing P Chan
(74) Attorney, Agent, or Firm—McNees Wallace & Nurick, LLC

(57) ABSTRACT

An optical coating is applied to an article surface of an article by providing a deposition substrate other than the article surface, wherein the deposition substrate is made of a removable material. The optical coating is thereafter deposited onto the deposition substrate. The optical coating is thereafter transferred to the article surface using a transfer support, which may be the deposition substrate or may be a different piece. The method includes thereafter affixing the optical coating to the article surface, and thereafter removing the transfer support.

18 Claims, 3 Drawing Sheets

METHOD FOR APPLYING AN OPTICAL COATING TO A SURFACE OF AN ARTICLE

RELATED APPLICATIONS

This application is a continuation application of U.S. application Ser. No. 10/702,801, filed Nov. 6, 2003 (abandoned), which is hereby incorporated by reference in its entirety.

This invention relates to optical coatings that are applied to article surfaces to alter their optical properties and, more particularly, to heat-rejecting coatings that reflect infrared energy.

BACKGROUND OF THE INVENTION

Some article components of gas turbine engines operate in a high-temperature environment produced by the combustion gases of the engine. Ever-higher operating temperatures are sought to improve the thermodynamic efficiency of the engine. In order to operate at high temperatures, the components are made of materials that retain the required mechanical properties at such temperatures. Even with the use of advanced materials such as superalloys, in some cases the capabilities of the materials are pushed to their limits, so that the operating temperature cannot be increased further.

Another approach is to create conditions in which the component operates cooler than it might otherwise, in the same high-temperature environment. One technique is to cool the component with a flow of cool air. Another technique is to coat the component with a ceramic thermal barrier coating that insulates the underlying metallic material from the hot combustion gases.

Yet another technique is to apply a heat-reflective coating, either a noble-metal layer or an optical coating, to the surface of the component to reflect an external heat load away from the component. That is, the heat energy radiated by the hot combustion gas and other hot components continues to be incident upon the coated component, but a part of the heat energy is reflected away from the component by the heat-reflective coating. The heat-reflective coating serves as a "heat mirror" to reflect heat from the surface in a manner somewhat analogous to a familiar light mirror that reflects light away from a surface. The noble-metal coating has limitations on its maximum use temperature due to diffusion and chemical interaction with some superalloys.

The heat-reflective optical coating typically has a multi-layer structure with a number of coating layers. The thicknesses of the layers are tailored to reflect the various optical wavelengths that carry the heat energy in the 0.5-3 micrometer wavelength range. The materials of the optical coating are selected to withstand the required operating temperature. Radiated heat energy from flames is largely transmitted in the high-visible and near-infrared wavelength ranges having wavelengths of about 0.5-3 micrometers. The thicknesses of the layers are usually small, with each layer of a stack having 3-90 layers being on the order of about 0.005-25 micrometers thick. Techniques for designing such optical coatings are well known.

To apply an optical coating to the surface of an article, the article is placed into a deposition apparatus appropriate for the type of optical coating to be deposited. Typical application techniques include chemical vapor deposition (CVD) and physical vapor deposition (PVD), each of which requires a specialized deposition apparatus. The component article is placed into the deposition apparatus and processed to deposit the optical coating. CVD has limitations on equipment size, and PVD is a line-of-sight deposition technique that cannot be used to coat articles of complex geometries.

While this deposition approach is operable, the work leading to the present approach has identified some significant process limitations in practical applications. The deposition apparatus must be made sufficiently large to accommodate the article upon which the optical coating is to be applied, and in many cases special deposition apparatus must be built for very large articles. The capital and operating costs for the special deposition apparatus are high. To achieve the maximum production economies, the deposition apparatus is desirably made sufficiently large to accommodate a number of the articles. The article surface upon which the optical coating is to be applied may have an irregular geometry, so that it is difficult or impossible to deposit the optical coatings, with precisely defined layer compositions and layer thicknesses, over the entire article surface.

These limitations present challenges at the original manufacturing facility where the new-make article is made, but even greater challenges for repair operations. Most repair operations are performed at sites away from the original manufacturing facility, so that any improvements to the deposition apparatus used to deposit the optical coating must be duplicated, and process improvements implemented, at the remote repair site, in order to repair the optical coatings. The high costs of the available approaches for providing the coatings inhibit the installation of the required apparatus at the remote repair sites.

The result of these limitations is that, although optical coatings offer important benefits, their use is limited by the manufacturing difficulties that are encountered in both new-make and repair applications of the optical coatings. There is a need for an approach to applying optical coatings that may be used in a wide range of circumstances and is economically applicable for both new-make and repair articles. The present invention fulfills this need, and further provides related advantages.

SUMMARY OF THE INVENTION

The present invention provides a method for applying an optical coating to a surface of an article. The optical coating reflects heat and may also be highly erosion resistant. The approach allows the optical coating to be deposited largely without any limit on the size of the article or the shape of the article. The approach also allows the deposition apparatus to be used efficiently, by maximizing the utilization of the volume within the deposition apparatus. In most cases, larger deposition apparatus is not required in order to protect a large number of components with the optical coating. The deposition is accomplished with high precision, so that precisely defined compositions and thicknesses of the layers are achieved regardless of the geometry of the article surface. The present approach is not dependent upon line-of-sight deposition relative to the ultimate substrate surface. The present approach allows repair procedures at remote sites to be performed with essentially the same processing procedures as used at the original manufacturing facility. In the case of most interest, the aircraft-engine application, remote repairs may be performed with the engine removed from the aircraft or, in some cases, while the engine remains installed on the aircraft.

A method for applying an optical coating to an article surface of an article comprises the steps of furnishing the article having the article surface, and providing a deposition substrate other than the article surface, wherein the deposition substrate is made of a removable material. The optical coating is thereafter deposited onto the deposition substrate. The optical coating has a first face contacting the deposition substrate, and a second face remote from the first face. The method further includes thereafter transferring the optical coating to the article surface using a transfer support, thereafter affixing the optical coating to the article surface, and thereafter removing the transfer support.

The removable deposition substrate is preferably an organic deposition substrate. The deposition substrate is removable by any operable approach. Non-mechanical removal techniques such as dissolution in the liquid state, or volatilizing or subliming to a vapor or gaseous state are preferred, although mechanical removable is acceptable where it is performed without damaging the optical coating. Most preferably, the deposition substrate is a polyvinyl alcohol deposition substrate that is soluble in water and may be readily dissolved and removed. Another operable deposition substrate is polypropylene, which may be removed by heating in vacuum to vaporize the polypropylene. Appropriate organic and inorganic salts may also be used as the removable deposition substrate or as a release material.

Two techniques are of particular interest for transferring the optical coating from the deposition substrate to the article substrate. In the first, the deposition substrate is used as the transfer support. The step of removing the transfer support then includes the step of removing the deposition substrate as discussed above, preferably by vaporizing or dissolving. This embodiment is used when the deposition substrate is sufficiently robust to accomplish the transfer function.

In the second technique, the step of transferring includes the steps of supplying the transfer support different from the deposition substrate, affixing the transfer support to the second face of the optical coating, and removing the deposition substrate. The step of removing the deposition substrate is performed as discussed above, preferably by vaporizing or dissolving. That is, in this second technique the deposition substrate is removed during the transfer operation, not during the final removal of the transfer support. The transport is preferably a compliant transfer support such as a castable elastomer, for example a castable silicone. The step of transferring may use a release system separate from the transfer support, or a release system integrated with the transfer support such as a polymeric releasable adhesive tape. Where the release system is separate from the transfer support, the release system may be applied to the second face of the optical coating, wherein the release system has a first face contacting the second face of the optical coating, and a second face remote from the first face. The step of affixing the transfer support includes the step of affixing the transfer support to the second face of the optical coating with the release system between the transfer support and the second face of the optical coating. In this embodiment, the release layer is, for example, a wax, a releasable adhesive, a salt, or the like. The transfer support is preferably a compliant material such as a castable silicone rubber.

In a preferred approach, the optical coating is a multilayer coating such as Si/SiO, $SiO_2/TiO_2$, or $SiO_2/Ta_2O_5$, applied in multiple repetitions. The use of the transfer support allows such complex optical coatings to be applied to curved surfaces and retain their functionalities. Even though the layers of the multilayer coating may crack when bent to conform to a curved surface, they are retained in place by the transfer support until affixed to the article surface, and retain their heat-reflectivity in service.

The article to which the optical coating is applied may be a component of a gas turbine engine, an application of particular interest. The article may be a new-make article that has not previously been in service, or an article, which has previously been in service and is being repaired and/or refurbished. The present approach has the particular advantage that the steps prior to affixing the optical coating to the article surface may be performed at a central location, and the assembly of the optical coating on the transfer support to the article surface thereafter performed at a remote location.

The step of affixing the first face may include positioning a bonding element between the optical coating and the article surface, and pressing the bonding element, and the article surface together at an elevated temperature. This affixing may be accomplished by bonding the bonding element to the article surface, and thereafter, bonding the optical coating to the bonding element. Alternatively, the optical coating may be bonded to the bonding element, and thereafter the bonding element is bonded to the article surface.

The present approach allows the optical coating to be prepared separately from the article and its article surface, on a deposition substrate. This deposition on the deposition substrate is accomplished in a conventionally sized deposition apparatus, which is not modified regardless of the size of the article. Many deposition substrates with optical coatings thereon may be prepared in a highly controlled manner, with precisely defined compositions and thicknesses of the layers of the optical coating. The space within the deposition apparatus is used efficiently as well. After the deposition substrate with the optical coating thereon is prepared, it is transferred via the transfer support to the article surface. The transfer support with the optical coating thereon may be prepared at a central facility under carefully controlled conditions, and then shipped to remote facilities such as repair facilities for affixing to the article surface. The deposition apparatus and processing therefore need not be duplicated at the repair facilities, an important economic and technical advantage. With this approach, the article to which the optical coating is applied is never placed into any deposition apparatus. The only apparatus that need be sized for the article in some embodiments is a heating-and-pressuring device, such as an autoclave. Large autoclaves are widely available, unlike large deposition apparatus. In some instances, the heating and pressure application may be performed with a vacuum bag and a local heat source, or an iron-on technique.

Another advantage of the present approach is that the optical coating may be implemented by preparing standardized pieces or tiles of the optical coating on the transfer support pieces at a central location. The standardized pieces of the optical coating are thereafter applied to the article to be protected at the central location or at remote sites. For example, standard 2 inch by 2 inch (and/or larger and/or smaller) pieces with the optical coating on the transfer support may be prepared. The pieces may be prepared in regular geometric patterns that cover a surface when applied in a tile-like fashion, such as triangles, squares, or hexagons. The pieces may instead have custom shapes. These pieces are then taken to the location where the coating is to be applied and affixed to the article surface by the approaches discussed herein. Other pieces may be cut to a required size and shape from a larger, standard piece. The pieces are applied in the manner of a plurality of tiles or a mosaic to the surface, making the handling easier as compared with a single large piece of optical coating/transfer support. The tiling approach also facilitates the application to curved or otherwise irregular article surfaces.

Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment.

DETAILED DESCRIPTION OF THE INVENTION

Figure 1:
FIG. 1 is a schematic sectional view of a component of a gas turbine engine with an optical coating thereon.

FIG. 1 depicts a component of a gas turbine engine, such as a combustor liner of a commercial high-by-pass turbofan gas turbine engine, which serves as an article 20 having an article surface 22. An optical coating 24 is deposited upon the article surface 22. In conventional practice as depicted in FIG. 1, the component is placed into a deposition apparatus that is appropriate for the type of optical coating 24 being deposited, and the optical coating 24 is deposited directly onto the article surface 22 in the deposition apparatus. However, such deposition is difficult or impossible in some cases, such as complexly shaped surfaces, large articles with large surfaces, and the like.

Figure 4:
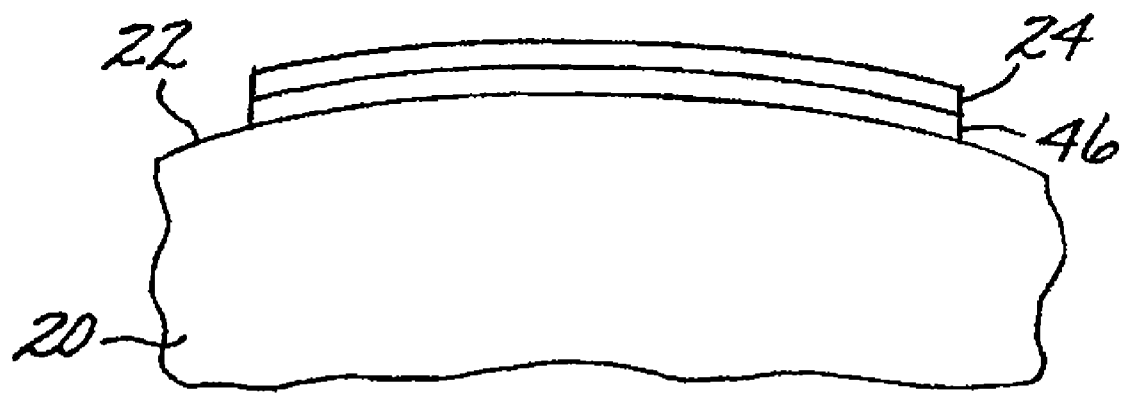
FIG. 4 is a schematic sectional view of an article with an optical coating affixed to the article surface.
Figure 2:
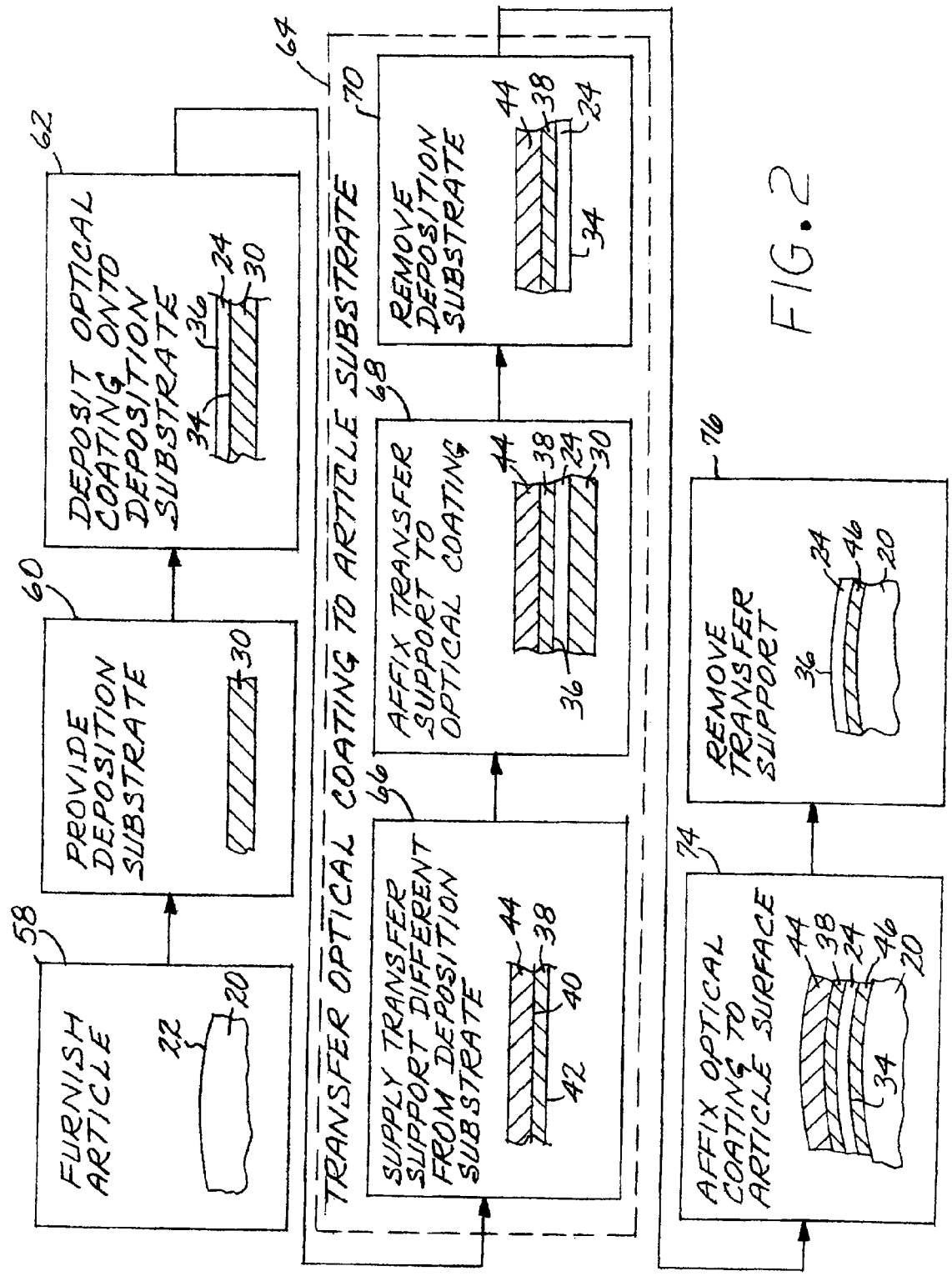
FIG. 2 is a block flow diagram of a first approach for preparing an article having the optical coating thereon, with the structure schematically illustrated at each stage.

The present approach utilizes a different approach to the application of the optical coating 24 onto the article 20. FIG. 2 is a pictorial block flow diagram of a first embodiment of the present approach, with the structure at each stage depicted schematically, and FIG. 4 depicts the article with the optical coating affixed thereto.

The article 20 with the article surface 22 is furnished, step 58. The article 20 may be a newly made article, or an article that has previously been in service and is to be repaired. In the latter case, any remnants of previously existing optical coatings, and other coatings and films, are first removed, and the article surface 22 is carefully cleaned at this point by conventional cleaning techniques.

A method for applying an optical coating 24 to the article surface 22 of the article 20 includes first providing a deposition substrate 30, step 60, which is subsequently sacrificed during the processing. The deposition substrate 30 is preferably made of an organic film material such as polyvinyl alcohol. The deposition substrate 30 serves both as a substrate and as a removable material that may subsequently be selectively separated from an optical coating that is applied thereon. The deposition substrate 30 is most preferably a thin sheet of the polyvinyl alcohol, typically from about 0.001 to about 0.015 inches thick. Polyvinyl alcohol is soluble in water. Another operable removable deposition substrate 30 is polypropylene, which may be removed by heating in vacuum to vaporize/sublime the polypropylene. Appropriate organic and inorganic salts may also be used as the removable deposition substrate 30 or release layer.

The optical coating 24 is thereafter deposited onto the deposition substrate 30, step 62. The optical coating 24 has a first face 34 contacting the removable deposition substrate 30, and a second face 36 remote from the first face 34.

The optical coating 24 may be of any operable type. Optical coatings 24 are available from a number of commercial manufacturers for other applications. Such optical coatings 24 are typically multilayer structures of alternating related compositions with different indices of refraction for the wavelengths of interest. (The optical coating may instead be a single-layer structure, such as a noble-metal heat-rejection coating, in some cases.) For the heat-reflective optical coatings 24, the wavelengths of interest are typically in the range of about 0.5-3.0 micrometers, depending upon the wavelengths of the radiation that is transmitting the heat. Examples of multilayer optical coatings 24 include multiple alternating layers of Si and SiO for operational temperatures up to about 1200° F., and multiple alternating layers of $SiO_2$ and $Ta_2O_5$ for operational temperatures above about 1200° F. These optical coatings not only reflect heat but, are also highly erosion resistant. (That is, the optical coatings have a higher resistance to erosion than the article substrates to which they are affixed.) Computer programs are available to design the optical coatings 24 for any application of interest. Examples are the commercially available Filmstar® and TF Calc™ programs. The deposition of the optical coating 24 is accomplished by any appropriate deposition technique, with examples being chemical vapor deposition (CVD) and physical vapor deposition (PVD) or sputtering. The various techniques for depositing optical coatings 24 all require special deposition apparatus that is expensive to construct and operate. In the present approach, the deposition apparatus is preferably located at a central manufacturing site, and is of a standard size and configuration. Different deposition apparatus for different applications, and for differently sized and shaped articles, is not required. The specific materials of construction, layer thicknesses, and numbers of layers in the optical coating 24, and the deposition procedure, are selected according to each specific application, and are not a part of the present invention.

The optical coating 24 is transferred to the article surface 22, step 64. "Transferred" as used in this context means that the optical coating 24 is physically moved to where the article 20 and its article surface 22 are located. Because the deposition substrate 30 may not be sufficiently robust to accomplish the transfer, particularly if the transfer is to a remote location, a transfer support 44 different from the deposition substrate 30 is used. The transfer support 44 is preferably a compliant material such as a castable elastomer that may be prepared and cast in a flowable form and then hardened. A most preferred material for the transfer support 44 is a castable silicone (although a stand-alone piece of a silicone or other material may instead be used). An example of a commercially available castable silicone is GE RTV664 silicone. Other castable or stand-alone organic materials may be used as well.

A release system 38 is applied either to one face of the transfer support 44 (as illustrated) or to the second face 36 of the optical coating 24. The release system 38 has a first face 40 contacting the transfer support 44, and a second face 42 remote from the first face 40. The release system 38 may include any operable release material, but is preferably a paste wax, a releasable adhesive, or a spray release material such as MS122 spray release material.

The transfer support 44 is thereafter affixed to the optical coating 24, step 68, with the release system 38 between the transfer support 44 and the second face 36 of the optical coating 24.

The two steps 66 and 68 may be performed sequentially with a discrete release system 38 and a discrete transfer support 44, as just described. The two steps 66 and 68 may instead be performed, and preferably are performed, using a single integral release system and transfer support that is used instead of the elements 38 and 44, and is applied to the second face 36 of the optical coating 24. A preferred single releaseand-transfer structure is polytetrafluoroethylene (3M Teflon™) tape. Such a releasable adhesive tape performs both the release function and also the transfer support function.

The deposition substrate 30 is thereafter removed from the optical coating 24, step 70. This removal step 70 is most readily performed by dissolving the deposition substrate 30 in the case of the polyvinyl deposition substrate 30, subliming the deposition substrate 30 in vacuum in the case of the polypropylene deposition substrate 30, or other removal technique specific to the composition of the deposition substrate. With the removal of the deposition substrate 30, the first face 34 of the optical coating 24 becomes an exposed free face.

The first face 34 of the optical coating 24 is thereafter affixed to the article surface 24, step 74, preferably using a bonding material. The affixing step 74 preferably includes furnishing a bonding element 46, positioning the bonding element 46 between the first face 34 of the optical coating 24 and the article surface 22, and pressing the bonding element 46, the first face 34, and the article surface 24 together at an elevated temperature. The bonding element 46 is selected so that its presence has no adverse impact, and in fact desirably is beneficial to the performance of, the article 20 and the optical coating 24. The preferred bonding element 46 is a multilayer tape (MLT) such as that described in U.S. Pat. No. 6,165,600, whose disclosure is incorporated by reference. In the preferred multilayer tape, an upper layer about 0.005 inches thick is of a finer aluminosilicate material, and a bottom layer about 0.015 inches thick is of a coarser aluminosilicate material. The pressing may be accomplished using an autoclave, with the elements enclosed in a vacuum bag or the like, as described in the '600 patent. This process bonds the bonding element 46 to both the article surface 22 and to the first face 34 of the optical coating 24.

An advantage of the present approach is that the affixing step 74 may be accomplished in various substeps that are selected to be particularly suitable for various circumstances. For example, the first face 34 of the optical coating 24 may be first bonded to the bonding element 46, and thereafter the bonding element 46 is bonded to the article surface 22. This approach is particularly useful to support the logistics of repair operations, since the preceding steps 60-70 and the bonding of the first face 34 to the bonding element 46 in step 74 may be accomplished at the central manufacturing facility, the bonded structure is shipped to the repair facility, and the affixing (step 74) of the bonding element 46 to the article surface 22 is performed at the repair facility. The bonding may be accomplished with the engine removed from the aircraft, or while the engine remains installed to the aircraft in some instances, in the case of the gas turbine engine application. In an alternative approach, the bonding element 46 is first bonded to the article surface 22, and thereafter the first face 34 of the optical coating 24 is bonded to the bonding element 46. In yet another approach, the elements 20 and 46, and the subassembly 24, 38, and 44, are stacked together and simultaneously bonded.

Another advantage of the present approach is that the pressing and heating of the affixing step 74 may be accomplished by any operable approach, and that a wide variety of methods may be used. For example, the pressing and heating may be accomplished in an autoclave. The pressing and heating may be accomplished with a vacuum bag and a heating source that encloses the entire article being coated. The pressing and heating may be accomplished with a vacuum bag and a heating source that process a limited area of the surface of the article in each application. Thus, the article may be enclosed in the vacuum bag, and locally heated with a heat gun. In yet another variation, the optical coating 24 attached to the transfer support 44 may be ironed onto the article surface 22. In all of these approaches, some of the heating may be accomplished in-situ by the heating of the article in service, after an initial partial bonding is performed before or upon the first placement of the article into service.

The transfer support 44 is removal from the optical coating 24, step 76. This removal step 76 may be accomplished either simultaneously with step 74 or subsequent to step 74. If the release system 38 is volatile at the temperature reached in the affixing step 74, the separation step 76 occurs simultaneously with the step 74. If the release system 38 is not volatile at this temperature, it may be dissolved away with a suitable release-coating solvent or peeled away from the optical coating, as demonstrated with Teflon™ tape, as the separate, subsequent step 76.

FIG. 4 depicts the resulting structure. The optical coating 24 is affixed to the article surface 22 by the bonding element 46. The structure is therefore different than that depicted in the conventional approach of FIG. 1, due to the presence of the bonding element 46. As noted, the bonding element 46 is selected so that its presence does not have an adverse influence on the properties of either the optical coating 24 or the article 20.

Figure 3:
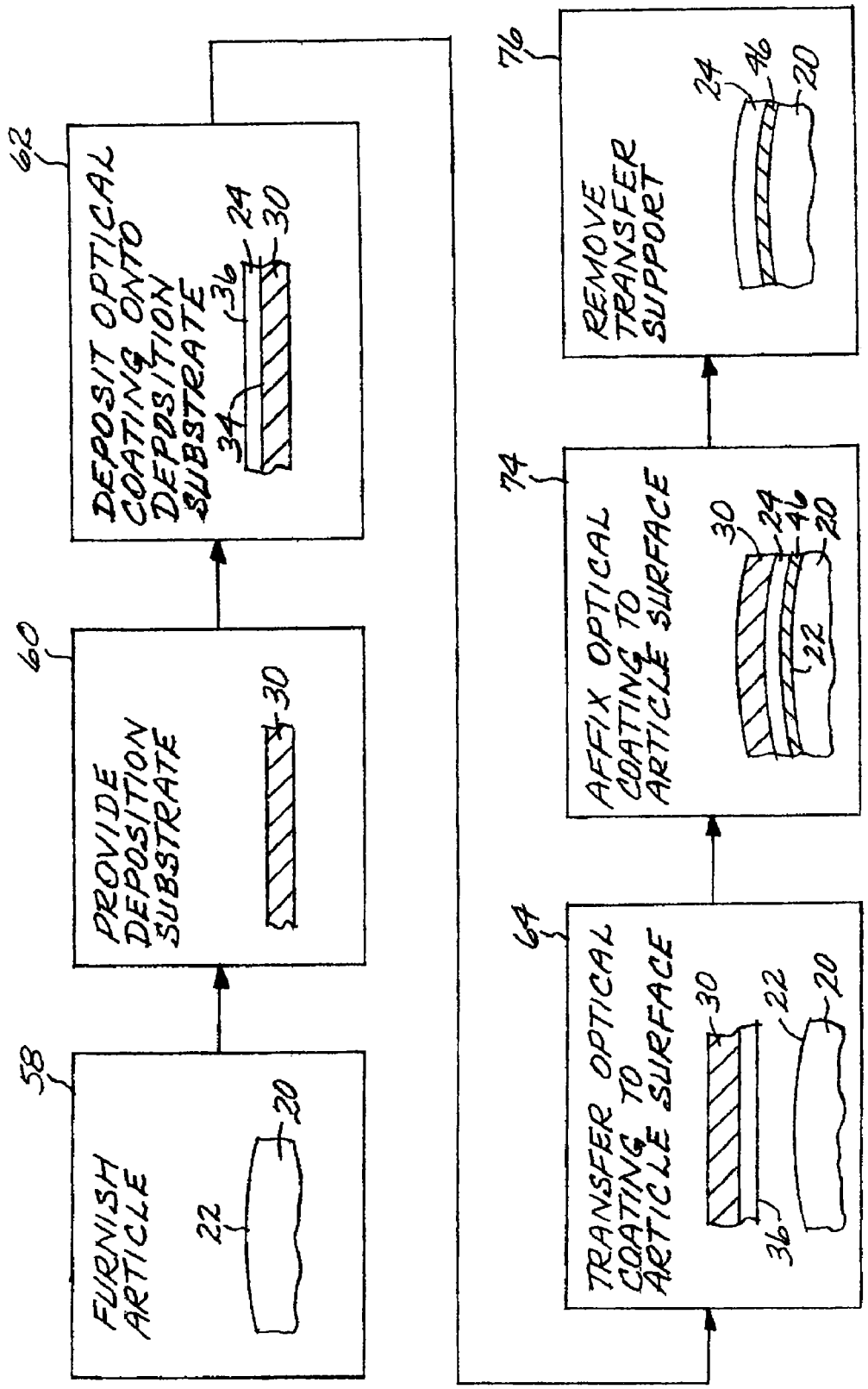
FIG. 3 is a block flow diagram of a second approach for preparing an article having the optical coating thereon, with the structure schematically illustrated at each stage.

FIG. 3 depicts a second embodiment of the method for accomplishing the application of the optical coating 24 onto the article surface 22. Steps 58, 60, and 62 are the same as described above, and that description is incorporated here. However, in this case the deposition substrate 30 is judged sufficiently robust to accomplish the transfer step 64, and therefore no transfer support different from the deposition support 30 is used. Instead, the deposition support 30 with the optical coating 24 thereon is inverted above the article surface 22, and then the steps 74 and 76 are performed as above, with the change discussed next. The prior description of steps 74 and 76 is incorporated here. Because the deposition substrate 30 serves as the transfer support, the deposition substrate 30 is removed in step 76, rather than as part of the transfer step 64 and specifically at step 70, as in the first embodiment of FIG. 2.

The present approach may be utilized to apply optical coatings in a wide variety of applications, and several applications are discussed next. In one embodiment, the optical coating is applied to a substrate that already has a thermal barrier coating thereon. That is, the new-make or repaired article 20 is a substrate with a thermal barrier coating thereon. In a second embodiment, the article 20 is a new-make or repaired ceramic matrix composite substrate. In a third embodiment, the article 20 is a metal substrate with no coating thereon. In a fourth embodiment, the article 20 is a metal substrate with an environmental or bond coat thereon.

The method of the invention, as discussed in relation to FIGS. 2 and 3, has been demonstrated on 2 inch by 2 inch flat test specimens using polyvinyl alcohol.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A method for applying an optical coating to a gas turbine engine component having a surface, comprising the steps of:
   furnishing the gas turbine engine component having the surface;
   providing a deposition substrate separate from the gas turbine engine component, wherein the deposition substrate is made of a removable material that is a polyvinyl alcohol substrate or a polypropylene substrate; thereafter depositing the optical coating onto the deposition substrate at a first location, wherein the optical coating has a first face contacting the deposition substrate, and a second face remote from the first face, wherein the optical coating is a multilayer coating selected from the group consisting of alternating layers of Si and SiO, alternating layers of $SiO_2$ and $TiO_2$, or alternating layers of $SiO_2$ and $Ta_2O_5$; thereafter transferring the optical coating to the surface of the gas turbine engine component using a transfer support at a second location remote from the first location; thereafter affixing the optical coating to the surface of the gas turbine engine component using a multilayer aluminosilicate tape by pressing the optical coating and the surface of the gas turbine engine component together with the multilayer aluminosilicate tape therebetween at an elevated temperature; and thereafter removing the transfer support completely.

2. The method of claim 1, wherein the step of transferring includes the step of using the deposition substrate as the transfer support, and wherein the step of removing the transfer support includes the step of removing the deposition substrate.

3. The method of claim 2, wherein the step of removing the deposition substrate includes the step of removing the deposition substrate by volatilizing, subliming, or dissolving the deposition substrate.

4. The method of claim 1, wherein the step of transferring includes the steps of supplying the transfer support different from the deposition substrate, affixing the transfer support to the second face of the optical coating, and removing the deposition substrate.

5. The method of claim 4, wherein the step of transferring includes the step of providing a transfer support as a castable elastomer.

6. The method of claim 4, wherein the step of transferring includes the steps of applying a release system to the second face of the optical coating, wherein the release system has a first face contacting the second face of the optical coating, and a second face remote from the first face, and wherein the step of affixing the transfer support includes the step of affixing the transfer support to the second face of the optical coating with the release system between the transfer support and the second face of the optical coating.

7. The method of claim 4, wherein the step of transferring includes the step of providing the transfer support having a release system integrated with the transfer support.

8. The method of claim 4, wherein the step of transferring includes the step of providing the transfer support as a polymeric releasable adhesive tape.

9. The method of claim 4, wherein the step of removing the deposition substrate includes the step of removing the deposition substrate by vaporizing or dissolving the deposition substrate.

10. The method of claim 1, wherein the step of affixing includes the step of positioning the multilayer aluminosilicate tape between the optical coating and the surface of the gas turbine engine component, and pressing the multilayer aluminosilicate tape and the surface of the gas turbine engine component together at an elevated temperature.

11. The method of claim 1, wherein the step of affixing includes the step of bonding the multilayer aluminosilicate tape to the surface of the gas turbine engine component, and thereafter bonding the optical coating to the multilayer aluminosilicate tape.

12. The method of claim 1, wherein the step of affixing includes the step of bonding the optical coating to the multilayer aluminosilicate tape, and thereafter bonding the multilayer aluminosilicate tape to the article surface of the gas turbine engine component.

13. The method of claim 1, wherein the step of affixing includes the step of heating and pressing using an autoclave.

14. The method of claim 1, wherein the step of affixing includes the step of heating and pressing using a vacuum bag and a general heat source.

15. The method of claim 1, wherein the step of affixing includes the step of heating and pressing using a vacuum bag and a local heat source.

16. The method of claim 1, wherein the step of affixing includes the step of ironing the optical coating onto the surface of the gas turbine engine component.

17. The method of claim 1, wherein the method includes the step of preparing the transfer support and optical coating as a plurality of individual tiles that are each affixed to the surface of the gas turbine engine component in the step of affixing.

18. A method for repairing a metallic component of a gas turbine engine having a surface, comprising the steps of:

furnishing the gas turbine engine having the surface;

providing a polyvinyl alcohol deposition substrate; thereafter depositing a multilayer optical coating onto the deposition substrate, wherein the optical coating has a first face contacting the deposition substrate, and a second face remote from the first face, and wherein the multilayer optical coating includes alternating layers of Si and SiO, alternating layers of $SiO_2$ and $TiO_2$, or alternating layers of $SiO_2$ and $Ta_7O_5$; thereafter transferring the optical coating to the component surface using the deposition substrate as a transfer support; thereafter affixing the optical coating to the component surface using a multilayer aluminosilicate tape by pressing the optical coating and the component surface together with the multilayer aluminosilicate tape therebetween at an elevated temperature; and thereafter removing the transfer support completely by volatizing, subliming or dissolving the deposition substrate.

* * * * *